United States Patent [19]
Corisis et al.

[11] Patent Number: 6,095,822
[45] Date of Patent: Aug. 1, 2000

[54] COMPONENT MODULE HOLDER

[75] Inventors: David J. Corisis, Meridian; Larry D. Kinsman, Boise; Walter Moden, Meridian, all of Id.

[73] Assignee: Micron Technology, Inc., Boise, Id.

[21] Appl. No.: 09/006,395

[22] Filed: Jan. 13, 1998

[51] Int. Cl.$^7$ ...................................................... H01R 9/09
[52] U.S. Cl. ........................... 439/65; 439/326; 439/328; 439/636
[58] Field of Search ............................. 710/102; 439/326, 439/328, 636, 65

[56] References Cited

U.S. PATENT DOCUMENTS

| | | |
|---|---|---|
| Re. 34,794 | 11/1994 | Farnworth . |
| 4,850,892 | 7/1989 | Clayton et al. ............................ 439/26 |
| 5,443,398 | 8/1995 | Ortega ..................................... 439/378 |
| 5,731,633 | 3/1998 | Clayton ................................... 257/723 |

*Primary Examiner*—Glenn A. Auve
*Assistant Examiner*—Tim Vo
*Attorney, Agent, or Firm*—Trop, Pruner & Hu, P.C.

[57] ABSTRACT

A component module holder is adapted to hold a plurality of integrated circuit devices in alignment with one another in a way that enables the devices to be directly plugged to a printed circuit board. In this condition, the holder is secured to said printed circuit board with the contacts on said integrated circuit devices making contacts with appropriate contacts on the printed circuit board. This direct contact between the packaged integrated circuit device leads and a board may reduce the die bond pad to board pad stub length, improving speed. This arrangement may also allow the integrated circuit devices to be replaced and upgraded as a whole as needed. The holder may be utilized, for example, to upgrade system integrated circuit devices in computer systems by providing a plurality of connected, integrated circuit dynamic random access memory elements directly pluggable onto a computer system motherboard.

39 Claims, 4 Drawing Sheets

COMPONENT MODULE HOLDER

This invention relates generally to a carrier or housing for holding a plurality of integrated circuit devices or die and in one particular application the holder holds a plurality of dynamic random access memory devices to enable upgrading of memory in a computer system.

BACKGROUND OF THE INVENTION

As technology advances, personal computer systems and other computer systems are experiencing increasing processor operating speeds and increasingly complex software applications. As a result, the demands for greater and faster system memory are increasing regularly.

One issue in achieving adequate microcomputer speeds is to increase the speed at which communication can occur between system memory and the microprocessor. Conventionally, memory modules made up of a plurality of packaged integrated circuit memory devices may be attached to a board. A connector on the memory board is connected to a connector on the motherboard which mounts the microprocessor. These connectors add to signal lead length between the memory and the processor. This reduces the speed of communication between memory and microprocessor conventional modules, including single in-line memory modules ("SIMMs"), dual in-line memory modules ("DIMMs"), and single in-line pin packages ("SIPPs").

While some processor upgrades may be conveniently accomplished by the user, normally a memory upgrade involves buying new memory modules and having a technician replace the appropriate modules. There is an increasing need for easily replaceable and upgradable component systems and particularly for upgradable and replaceable memory modules for computer systems. Moreover, there is a need to improve the speed of communications between memory modules and microprocessors in computers.

SUMMARY OF THE INVENTION

A component module holder is adapted to hold a plurality of integrated circuit devices in alignment with one another in a way that enables the devices to be directly plugged to a printed circuit board. In this condition, the holder is secured to the printed circuit board with the contacts on the integrated circuit devices making contacts with appropriate contacts on the printed circuit board. This direct contact between the packaged memory device leads and a board may reduce the die bond pad to board pad length, improving speed. This arrangement also may allow the integrated circuit devices to be replaced and upgraded as a whole as needed.

In accordance with one aspect of the present invention, a holder for a plurality of packaged integrated circuit devices on a printed circuit board having contacts includes a connector for connecting the devices together. The devices have leads with contact edges. The connector is adapted to arrange the devices with their contact edges in substantially the same plane. An element is arranged to mechanically position the contact edges directly on the printed circuit board in contact with the contacts on the board.

In accordance with another aspect of the present invention, a carrier for a plurality of integrated circuit devices, having leads, to be mounted on a printed circuit board includes a housing. The housing is adapted to receive a plurality of integrated circuit devices. The housing is also adapted to position the integrated circuit devices for electrical contact between the leads and the printed circuit board. A mechanical connector connects the devices to the printed circuit board.

In accordance with still another aspect of the present invention, a mounting for a plurality of integrated circuit devices, each having at least one electrical contact, includes a bracket for securing the devices with their electrical contacts aligned. The contacts are spaced by the bracket to align with target contacts on a printed circuit board. A connector is provided for connecting the devices to the printed circuit board.

In accordance with but another aspect of the present invention, a method of upgrading an electronic device having a plurality of components mounted on a printed circuit board includes the step of removing the components from the printed circuit board. A unit provides a plurality of upgraded electronic components and arranges each of the upgraded electronic components with their leads substantially in a common plane. The leads are contacted directly on the printed circuit board and the unit is secured to the printed circuit board.

In accordance with yet another aspect of the present invention, a computer system includes a motherboard having at least one microprocessor. A plurality of electrical contacts on the motherboard are arranged to connect to integrated circuit devices. A user detachable module is adapted to hold a plurality of devices, each having at least one electrical contact. The devices are arranged in the module so that their contacts may be releasably connected to the plurality of contacts on the motherboard.

In accordance with another aspect of the present invention, a computer system includes a motherboard with at least one microprocessor. A plurality of electrical contacts on the motherboard connect to memory devices. A user detachable memory module is also provided. The module is adapted to hold a plurality of memory devices, each having at least one electrical contact. The devices are arranged in the module so that the contacts may be releasably connected to the plurality of contacts on the motherboard.

In accordance with still another aspect of the present invention, a motherboard is adapted to receive at least one microprocessor. A plurality of electrical contacts on the motherboard are provided for connecting to integrated circuit devices. A user detachable memory module is adapted to hold a plurality of the devices, each having at least one electrical contact. The devices are arranged in the module so that the contacts may be releasably connected to a plurality of contacts on the motherboard.

In accordance with yet another aspect of the present invention, a method for updating a computer system includes the step of providing a motherboard with a plurality of contacts adapted to releasably contact integrated circuit devices. A plurality of integrated circuit devices are connected together and placed in releasable contact with the motherboard. The devices are removed as a unit and replaced with a plurality of upgraded devices. The devices are held together as a unit and plugged into the motherboard so as to make contact with the contacts on the motherboard to replace the previously connected integrated circuit devices.

DESCRIPTION OF THE PREFERRED EMBODIMENTS

Figure 1:
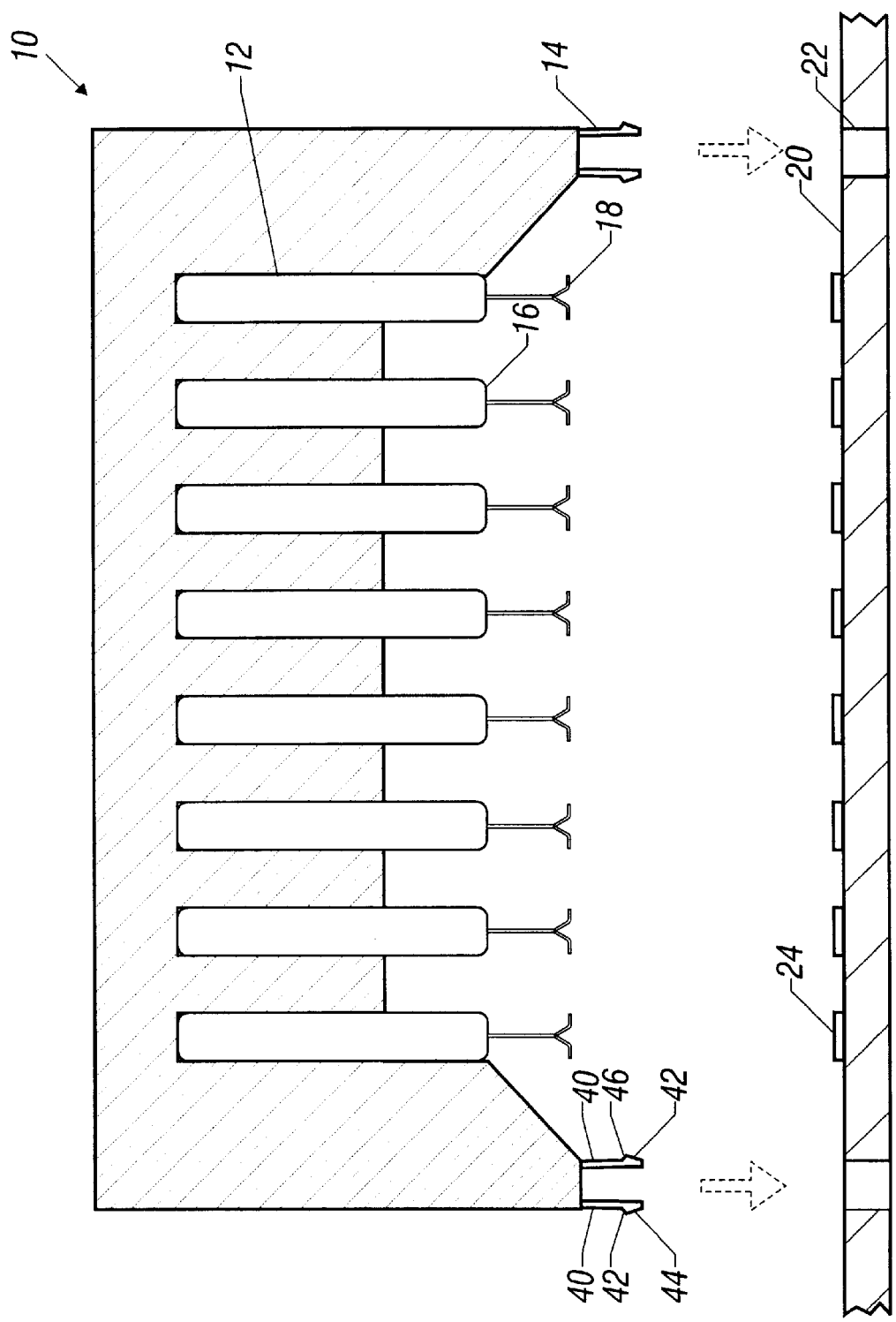
FIG. 1 is an enlarged cross-sectional view of one embodiment of a component module holder.

Referring to the drawing wherein like reference characters are used for like parts throughout the several views, a component module holder 10, shown in FIG. 1, includes a plurality of vertically oriented slots 12 adapted to hold integrated circuit packages 16. While the circuit packages 16 are illustrated as vertical mount packages, other integrated circuit packages may be utilized as well.

Each of the integrated circuit packages 16 may be secured inside the slots 12 using appropriate adhesives, press fit connections or any other conventional connection. The packages 16 are arranged such that their leads 18 extend outwardly from the package in co-linear alignment with one another. While the leads 18 shown in FIG. 1 are J leads, a variety of other styles of leads may be utilized as well. Advantageously, the leads 18 may be very thin and flexible. For example, leads on the order of 6 mils in width are advantageous.

Figure 2:
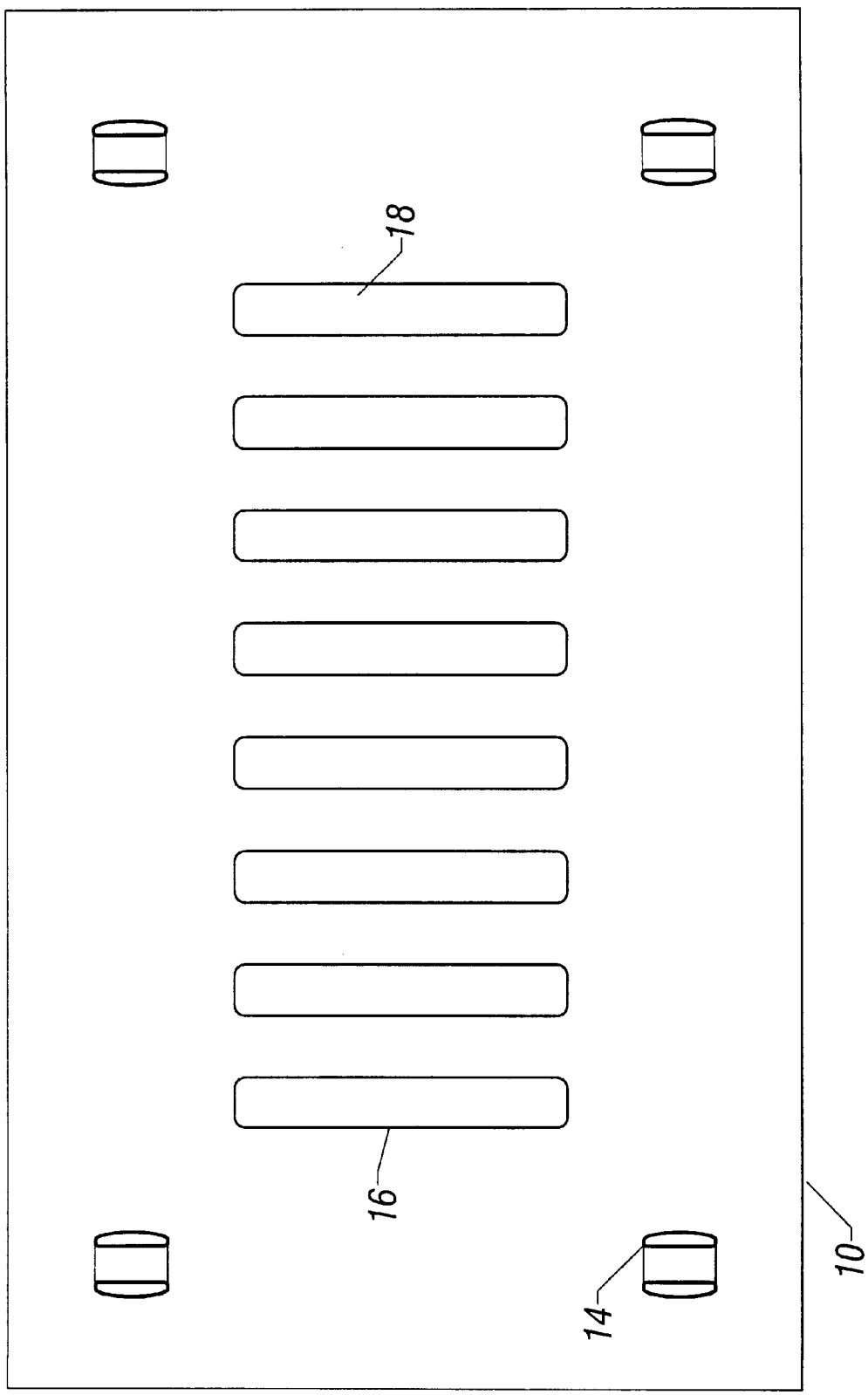
FIG. 2 is a bottom plan view of the connector shown in FIG. 1.
Figure 3:
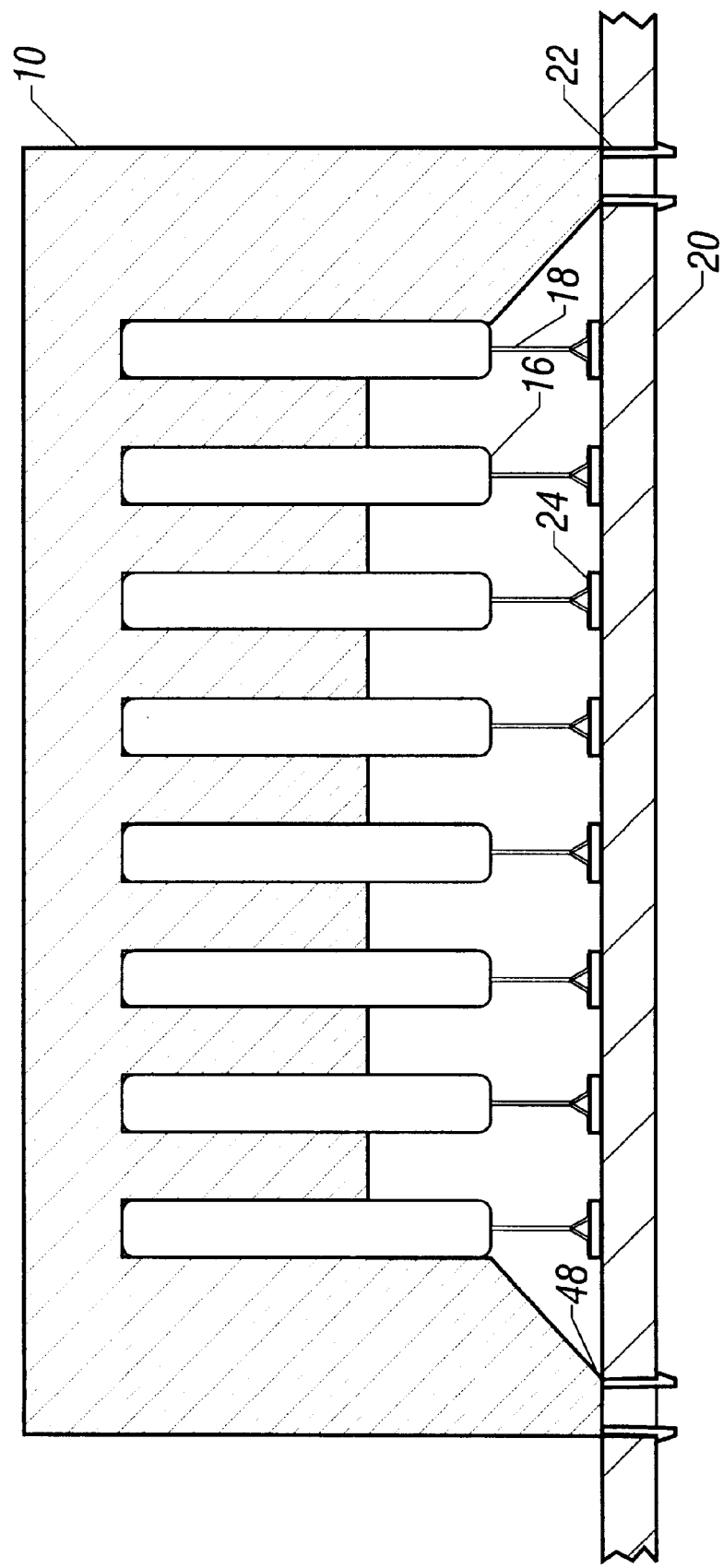
FIG. 3 is a vertical cross-sectional view of the embodiment shown in FIG. 1 in position on a printed circuit board.

The holder 10 may include one or more pluggable pins 14, as shown in FIG. 2. Four pins 14 may be provided, one at each corner of the holder 10. The pins 14 mate with slots or holes 22 in a card or printed circuit board 20 as shown in FIG. 3. The pins 14 may be soldered or press fit onto the board 20. The board 20 has a plurality of land pads 24 along its surface which are arranged to align with and contact the leads 18 which extend downwardly from the component module holder 10.

As shown in FIG. 1, the pins 14 may have releasably locking ends 40 to prevent the holder 10 from coming loose from the board 20. As illustrated, the end 40 includes a pair of spaced, tapered tabs 42. When the tapered surface 44 of a tab 42 engages a hole 22, it springs inwardly flexing each end 40 inwardly and then the ends 40 snap outwardly after they are inserted through the board 20. The locking edge 46, having less taper than the surface 44, releasably locks the holder 10 on the board 20. Those skilled in the art will appreciate numerous other releasably locking connections.

Thus, as shown in FIG. 3, when the component module holder 10 has been fully inserted into the printed circuit board 20, the leads 18 make electrical contact with the land pads 24 on the board 20. The stop surface 48 prevents overpressuring the leads 18, which could result in damage, and gives the user feedback that the holder 10 has been fully inserted. This contact between the leads 18 and the board 22 may be accomplished by mere pressure contact. Advantageously, the leads 18 are spring biased against the board 22. The leads may also be soldered. In other cases, the leads may be inserted into appropriate connector sockets. In addition, an electrical connection can be made using Z-axis material on the printed circuit board which contacts appropriately shaped leads 18.

The module holder 10 may be made of plastic, metal, ceramic, glass or epoxy. In addition, the packages 16 in the module holder 10 could be arranged vertically as illustrated or at some other angle to reduce the overall height of the holder 10.

Figure 4:
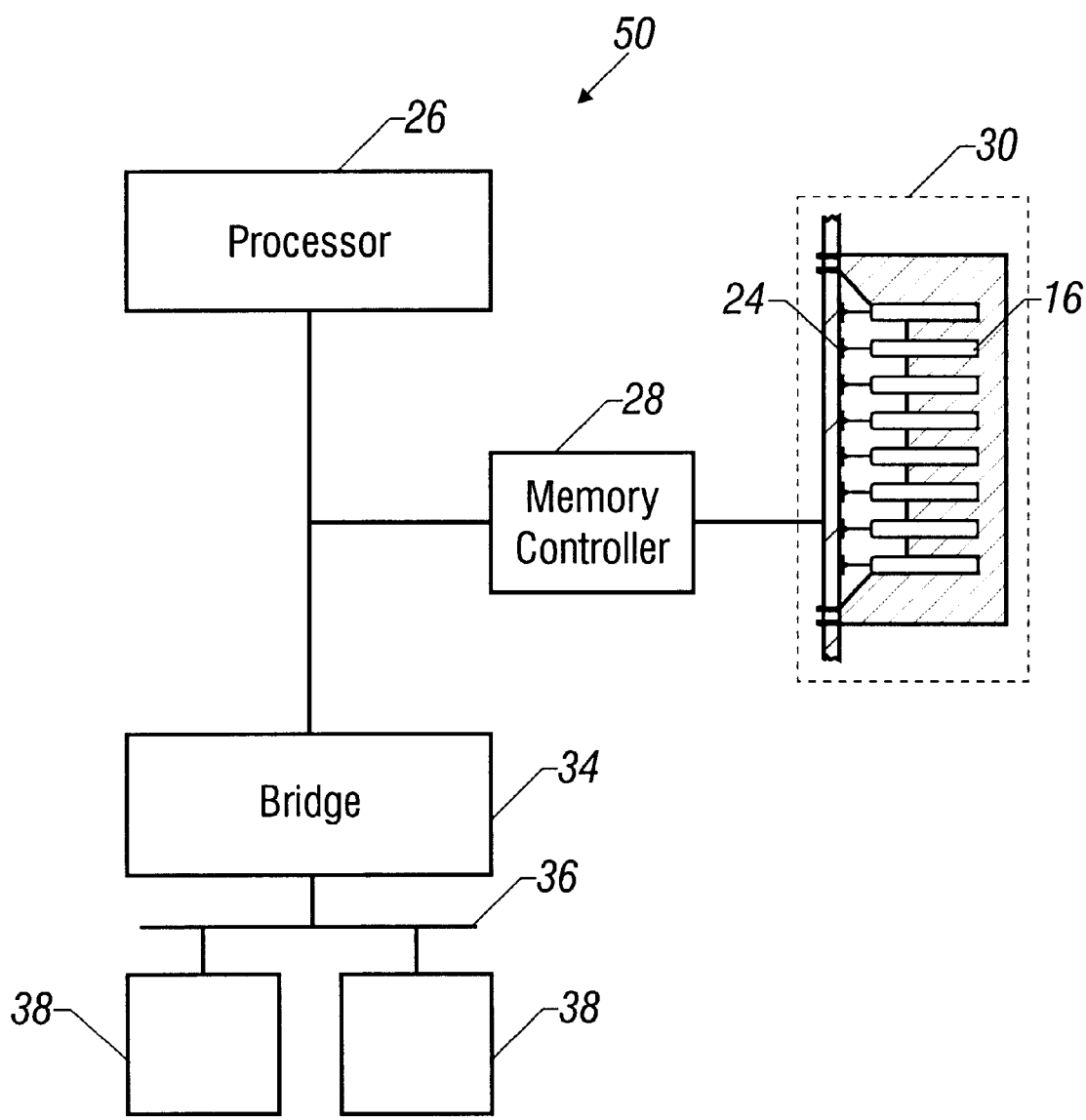
FIG. 4 is a schematic diagram of one exemplary computer system including the component module holder.

Referring to FIG. 4, a computer system 50 includes a microprocessor 26, a memory controller 28 and system memory 30. The memory controller 28 may connect to a conventional bridge 34 which in turn connects to a Peripheral Component Interconnect (PCI) bus 36. One or more input/output devices 38 may in turn be connected to the PCI bus 36 in a conventional fashion. The system memory 30 may be implemented by a plurality of contacts 24 which are arranged to connect to dynamic random access memory (DRAM) modules.

The modules may be implemented by integrated circuit packages 16 as shown in FIG. 1. When the packages 16 are connected to the motherboard 20, the memory module holder 10 is plugged into or onto the appropriate contacts 24. The memory chips are thereafter controlled in a conventional fashion by the controller 28.

When it is desired to upgrade the system memory, a new component module holder 10 may be provided with upgraded memory integrated circuit packages 16. These upgraded packages can be plugged into the contacts 24, shown in FIG. 3, in the system memory which may correspond to the land pads 24, shown in FIG. 2. In this way, the user can easily plug in an upgraded system memory package using the component module holder 10 as circumstances warrant.

With the techniques disclosed herein, one can reduce the spacing between the die bond pad to the motherboard. This reduced stub length contributes to speed. For example, stub lengths of 5 millimeters or less from the die bond pad to the motherboard trace (land pad) may be implemented.

While the present invention has been described with respect to a limited number of preferred embodiments, those skilled in the art will appreciate numerous modifications and variations. For example, while the holder is described in connection with system memory upgrades it can also be used to implement cache memory upgrades using Static Random Access Memory (SRAM) or to upgrade video memory using Video Random Access Memory (VRAM). It is intended that the appended claims cover all such modifications and variations as fall within the true spirit and scope of the present invention.

What is claimed is:

1. A holder for a plurality of packaged integrated circuit devices on a printed circuit board having contacts, said holder comprising:

a connector for connecting said devices together, said devices having leads having a contact edge, said connector adapted to arrange said devices with their contact edges in substantially the same plane; and an element arranged to mechanically position said contact edges directly on said printed circuit board in contact with said contacts on said board.

2. The holder of claim 1 wherein said devices contain integrated circuits.

3. The holder of claim 1 wherein said packaged integrated circuit devices are in vertical packages.

4. The holder of claim 1 wherein said connector includes a housing with a plurality of slots formed therein, said devices being held in said slots.

5. The holder of claim 1 wherein said contact edges are in pressure contact with said board.

6. The holder of claim 4 wherein said element makes sliding mechanical contact with said board.

7. The holder of claim 5 wherein said edges are spring biased against said board.

8. The holder of claim 6 wherein said element releasably locks on said board.

9. The holder of claim 7 having a stub length not greater than 5 millimeters.

10. The holder of claim 8 wherein said element includes spring catches that engage the side of said board opposite the side adjacent said devices.

11. A carrier for a plurality of integrated circuit devices, having leads, to be mounted on a printed circuit board, said carrier comprising:
   a housing adapted to receive a plurality of integrated circuit devices, said housing adapted to position said devices for electrical contact between said leads and said printed circuit board; and
   a mechanical connector for connecting said devices to said printed circuit board such that said carrier has a stub length of not greater than 5 millimeters.

12. The carrier of claim 11 wherein said device leads are in pressure contact with said printed circuit board.

13. The carrier of claim 11 wherein said housing is formed of a block of material with a plurality of slots formed therein for receiving said devices.

14. The carrier of claim 13 wherein said mechanical connector includes a plurality of pins extending outwardly from said block, said pins adapted to engage said printed circuit board.

15. The carrier of claim 11 including land pads on said board, wherein said leads resiliently contact said pads on said board.

16. The carrier of claim 11 wherein said leads have a width of about 6 mils or less.

17. The carrier of claim 14 wherein said pins releasably lock on said board.

18. The carrier of claim 15 wherein no electrical connector is used between said leads and pads on said board.

19. The carrier of claim 17 wherein at least one of said leads directly contacts a land pad on said board.

20. A mounting for a plurality of integrated circuit devices each having at least one electrical contact, said mounting comprising:
   a bracket for securing said devices together with their electrical contacts aligned;
   said contacts being spaced by said bracket to align with target contacts on a printed circuit board; and
   a connector arranged to connect said devices to said printed circuit board.

21. The mounting of claim 20 wherein said integrated circuit devices are contained in integrated circuit packages being held by said bracket, said packages being vertical packages and having a lead extending from one end thereof, the leads of said vertical packages being aligned with one another such that all of said packages may be positioned on said printed circuit board with their leads in contact with said printed circuit board.

22. The mounting of claim 21 wherein said connector includes a pin on said bracket which engages an opening in said printed circuit board.

23. A method of upgrading an electronic device having a plurality of components mounted on a printed circuit board comprising the steps of:
   removing the components from the printed circuit board;
   providing as a unit a plurality of upgraded electronic components;
   arranging each of said upgraded electronic components with their leads substantially in a common plane;
   contacting said leads directly on said printed circuit board; and
   securing said unit to said printed circuit board.

24. The method of claim 23 including placing said leads in pressure contact on said board.

25. The method of claim 23 including holding said upgraded electronic devices in a housing and securing said housing to said board.

26. The method of claim 24 including connecting said upgraded electronic components to said board with a stub length not exceeding 5 millimeters.

27. A computer system comprising:
   a motherboard having at least one microprocessor;
   a plurality of electrical contacts on said motherboard arranged to connect to said integrated circuit devices; and
   a user detectable module, said module adapted to hold a plurality of integrated circuit devices, each having at least one electrical contact, said devices arranged in said module so that said contacts may be releasably connected to said plurality of contacts on said motherboard, the stub length not exceeding 5 mils.

28. The computer system of claim 27 wherein said module includes a housing with a plurality of slots, said slots adapted to receive a plurality of vertical packages containing memory devices.

29. The computer system of claim 28 wherein each of said vertical packages includes leads extending from one end thereof, said leads of said packages being aligned with another.

30. The computer system of claim 29 wherein said leads are in pressure contact with said contacts on said motherboard.

31. A motherboard for a computer system, adapted to receive at least one microprocessor, said motherboard comprising:
   a plurality of contacts arranged to connect to integrated circuit devices; and
   a user detachable module, said module adapted to hold a plurality of integrated circuit devices each having at least one electrical contact, said devices arranged in said module so that said contacts may be releasably connected to said plurality of contacts on said motherboard, said module including a housing with a plurality of slots formed therein, said devices being retained in said slots with their contacts aligned with one another on the exterior of said module, said module further including a mechanical connection adapted to engage said motherboard, such that once connection is made to said motherboard, said contacts on said devices are in contact with said contacts on said motherboard.

32. The motherboard of claim 31 wherein said devices are in the form of packaged integrated circuit dynamic random access memories.

33. The motherboard of claim 31 wherein said contacts are land pads.

34. A method for updating a computer system comprising the steps of:
   providing a motherboard with a plurality of contacts adapted to releasably contact integrated circuit devices;
   connecting a plurality of integrated circuit devices together;
   placing said devices in direct releasable contact with said motherboard;
   removing said integrated circuit devices as a unit; and
   replacing said integrated circuit devices with a plurality of upgraded integrated circuit devices, said integrated circuit devices held together as a unit and plugged into said motherboard so as to make direct contact with the contacts on said motherboard and to replace the previously connected integrated circuit devices.

35. The method of claim 34 including the steps of securing a plurality of devices in a housing and releasably connecting said housing to said motherboard such that the contacts on said integrated circuit devices make contact with said contacts on said motherboard.

36. The method of claim 34 including the steps of forming a plurality of conformal openings in a housing and securing said devices in said openings in said housing with the contacts of each of said devices extending out of said housing, such that said contacts are aligned with one another.

37. The method of claim 34 including the step of making the stub lengths not greater than 5 millimeters.

38. The method of claim 36 including the step of placing said contacts on said devices in pressure contact with said contacts on said motherboard.

39. A carrier for a plurality of integrated circuit devices, having leads, to be mounted on a printed circuit board, said carrier comprising:

a housing adapted to receive a plurality of integrated circuit devices, said housing adapted to position said devices for electrical contact between said leads and said printed circuit board, said leads having a width which is not greater than about 6 mils; and a mechanical connector for connecting said devices to said printed circuit board.

* * * * *